United States Patent
Ni (10) Patent No.: US 7,365,985 B1
(45) Date of Patent: Apr. 29, 2008

(54) MEMORY MODULE ASSEMBLY INCLUDING HEAT SINK ATTACHED TO INTEGRATED CIRCUITS BY ADHESIVE

(75) Inventor: Jim Ni, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 79 days.

(21) Appl. No.: 11/382,467

(22) Filed: May 9, 2006

Related U.S. Application Data (63) Continuation-in-part of application No. 10/956,893, filed on Sep. 29, 2004, now Pat. No. 7,215,551.

(51) Int. Cl.
*H05K 7/20* (2006.01)

(52) U.S. Cl. .................. 361/715; 361/707; 361/719; 361/728; 361/737; 165/80.3; 165/104.33; 165/185; 174/16.3

(58) Field of Classification Search ............... 361/688, 361/690, 703–715, 719–720, 737; 165/80.2, 165/80.3, 104.33, 185; 257/706–708, 712–713, 257/717–722, 726, 727; 174/16.3, 16.1; 24/457, 458; 248/505, 510

See application file for complete search history.

(56) References Cited

U.S. PATENT DOCUMENTS

| | | | |
|---|---|---|---|
| 4,606,962 A | 8/1986 | Reylek et al. | |
| 5,109,318 A * | 4/1992 | Funari et al. | 361/710 |
| 5,313,097 A | 5/1994 | Haj-Ali-Ahmadi et al. | |
| 5,475,563 A | 12/1995 | Donahoe et al. | |
| 5,661,339 A | 8/1997 | Clayton | |
| 5,731,633 A | 3/1998 | Clayton | |
| 5,751,553 A | 5/1998 | Clayton | |
| 5,793,609 A | 8/1998 | Donahoe et al. | |
| 5,892,660 A | 4/1999 | Farnworth et al. | |
| 6,049,975 A | 4/2000 | Clayton | |
| 6,091,145 A | 7/2000 | Clayton | |
| 6,232,659 B1 | 5/2001 | Clayton | |
| 6,353,538 B1 | 3/2002 | Ali et al. | |
| 6,362,965 B2 | 3/2002 | Bookhardt et al. | |
| 6,362,966 B1 | 3/2002 | Ali et al. | |
| 6,377,460 B1 | 4/2002 | Pohl et al. | |
| 6,424,532 B2 * | 7/2002 | Kawamura | 361/708 |
| 6,449,156 B1 * | 9/2002 | Han et al. | 361/704 |
| 6,661,661 B2 | 12/2003 | Gaynes et al. | |
| 6,781,848 B2 | 8/2004 | Farnworth et al. | |

(Continued)

FOREIGN PATENT DOCUMENTS

JP          2000251463          9/2000

(Continued)

*Primary Examiner*—Michael Datskovskiy
(74) *Attorney, Agent, or Firm*—Bever, Hoffman & Harms, LLP; Patrick T. Bever (57) ABSTRACT

A memory module assembly includes two-plate heat sink attached to one or more of the integrated circuits (e.g., memory devices) of a memory module PCBA by adhesive. The adhesive is either heat-activated or heat-cured. The adhesive is applied to either the memory devices or the heat-sink plates, and then compressed between the heat-sink plates and memory module using a fixture. The fixture is then passed through an oven to activate/cure the adhesive. The two heat sink plates are connected together to form a rigid frame.

27 Claims, 10 Drawing Sheets

U.S. PATENT DOCUMENTS

| | | |
|---|---|---|
| 7,023,700 B2 | 4/2006 | Chiou et al. |
| 7,079,396 B2 * | 7/2006 | Gates et al. ............... 361/719 |
| 7,106,595 B2 | 9/2006 | Foster et al. |
| 2002/0001180 A1 | 1/2002 | Kawamura |
| 2002/0079117 A1 | 6/2002 | Coffin et al. |
| 2003/0026076 A1 * | 2/2003 | Wei ........................ 361/704 |
| 2003/0193788 A1 | 10/2003 | Farnworth et al. |
| 2005/0276021 A1 | 12/2005 | Gates et al. |
| 2006/0056154 A1 | 3/2006 | Foster et al. |

FOREIGN PATENT DOCUMENTS

| | | | |
|---|---|---|---|
| KR | 336757 B | * | 5/2002 |
| KR | 2002045747 A | * | 6/2002 |

* cited by examiner

MEMORY MODULE ASSEMBLY INCLUDING HEAT SINK ATTACHED TO INTEGRATED CIRCUITS BY ADHESIVE

CROSS-REFERENCE TO RELATED APPLICATIONS

The present application is a continuation-in-part of co-owned and co-pending U.S. application Ser. No. 10/956,893, filed Sep. 29, 2004, entitled "MEMORY MODULE ASSEMBLY INCLUDING HEAT SINK ATTACHED TO INTEGRATED CIRCUITS BY ADHESIVE", which is incorporated herein by reference in its entirety.

FIELD OF THE INVENTION

This invention relates to standardized memory modules for expanding the memory capacity of personal computers and other computing systems, and more particularly to memory module assemblies that include heat-sink structures.

BACKGROUND OF THE INVENTION

Heat sinks have been widely used to assist in cooling electronic components. Some microprocessors have heat sinks attached to allow for higher-frequency operation. Other components such as memory modules may also benefit from heat sinks.

Most personal computers (PC's) are shipped with sockets for memory modules so that their owners can later add additional modules, increasing the memory capacity of the PC. Other non-PC devices may also use memory modules designed for PC's. High-volume production and competition have driven module costs down dramatically, benefiting the buyer.

Memory modules are made in many different sizes and capacities, with the older 30-pin modules replaced by 72-pin, 168-pin, and other size modules. The "pins" were originally pins extending from the module's edge, but now most modules are lead-free, having metal contact pads, fingers, or leads. The modules are small in size, some being about 5.25 inches long and 1.2 or 1.7-inches high.

Conventional memory modules include a small printed-circuit board (PCB) substrate and several surface mounted components (e.g., memory devices) mounted on one or both surfaces of the PCB substrate. The PCB substrate is typically a multi-layer board with alternating laminated layers of fiberglass insulation and foil or metal interconnection layers. The contact pads (or other contact structures) are typically aligned along a bottom (connector) edge of the PCB substrate. The interconnect layers define wiring traces that provide signal paths between the surface mounted components and the contact pads. The surface mounted components (e.g., memory devices) are soldered or otherwise attached to one or both surfaces of the substrate, with each component typically including one or more integrated circuit (IC) "chips" that are packaged in inexpensive surface-mount packages such as small-outline J-leaded (SOJ) packages, plastic leaded chip carriers (PLCC's), thin small-outline packages (TSOP) or small-outline (SO) packages. The number of memory devices mounted on the PCB substrate of a memory module depends on the capacity and the data-width of the memory chips and the size of the memory module.

Figure 13:
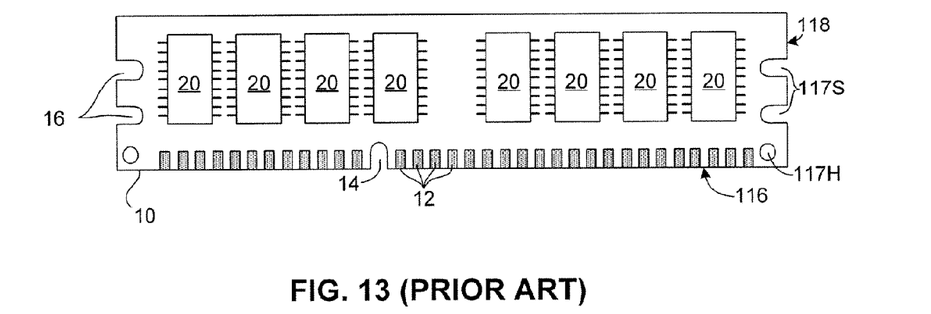
FIG. 13 is a top view showing a conventional memory module PCBA.

FIG. 13 is a diagram showing a memory module with dynamic-random-access memory (DRAM) devices. The memory module contains substrate 10, with surface-mounted DRAM devices 20 mounted directly to the front surface or side of substrate 10, while more DRAM devices (not visible) are usually mounted to the back side or surface of substrate 10. Metal contact pads 12 are positioned along the bottom or connector edge of the module on both front and back surfaces. When the memory module is mounted into a host system (e.g., a personal computer (PC)), metal contact pads 12 mate with pads on a module socket (not shown) to electrically connect the module to the host system's motherboard. Holes and/or notches 14, 16 are sometimes used to ensure that the module is correctly positioned in the socket. For example, notch 14 can be offset from the center of substrate 10 to ensure that the memory module cannot be inserted backwards in a socket. Notches 16 match with clamps of the module socket to ensure that the memory module is securely positioned in the socket.

As processor speeds have increased, the need for faster memory has become more critical. Various bandwidth-enhancing methods and memory interfaces have been used. Memory chips have higher densities and operate at higher frequencies than before, producing more waste heat from the memory chips. Thus, a need has arisen to remove this waste heat from memory modules.

Conventional memory module assemblies typically include three components: the memory module PCBA and two metal heat-sink plates that are coupled together using one or more fasteners, such as a metal clamp. The contact between PCBA and metal heat-sink plate is usually aided by sandwiching a tape of thermal interface material (TIM) in-between. Various heat-sink plates have been designed for producing such memory module assemblies. See for example U.S. Pat. Nos. 6,362,966, 6,424,532, and 6,449,156, among others. Clamp-on heat-sink plates for memory modules are also known. For example, OCZ Technology produces a copper heat sink with wider metal bands that clip the heat sink to over the front and back surfaces of the memory module. These clip-on and clamp-on designs increase the manufacturing costs and complexity of the associated memory modules because they are difficult to incorporate into automated production lines. Further, the use of clamps or similar structures facilitates easy disassembly by users, resulting in undesirable situations. Moreover, the presence of the clamps and thermal interface material increase the overall thickness of the memory module assembly, thereby taking up valuable motherboard space.

Some memory-module heat sinks feature a closed-top design that prevents airflow in the small gaps between the heat sink and the memory module substrate. Often the entire top edge of the heat sink is closed, providing no path for air to flow under the heat sink other than back out the bottom edge, which is usually open. Sides may be open or partially open, but the sides are much smaller than the top and bottom edges of the memory module, limiting the possible air-flow.

What is needed is a memory module assembly having a protective metal heat-sink plate (shield) mounted over the surface mounted IC devices of a memory module PCBA that both serves to protect the PCBA and to dissipate heat generated by the IC devices, and is easily and inexpensively produced using automated methods.

SUMMARY OF THE INVENTION

The present invention is directed to a memory module assembly including one or more heat sink plates that are directly attached to one or more of the integrated circuits (IC) devices of a memory module printed circuit board assembly (PCBA) using an adhesive, whereby the heat-sink plates both protect the memory module PCBA and dissipate heat generated by the IC devices thereof. By directly attaching the heat-sink plates to the IC devices of the memory module PCBA, the present invention facilitates a simplified automated manufacturing method that greatly reduces overall production costs.

The memory module assembly of the present invention utilizes a memory module PCBA that is essentially identical to conventional memory modules, thus allowing the present invention to be utilized with existing electronics. That is, similar to conventional memory modules, the IC devices are surface mounted on one or both surfaces of a printed-circuit board (PCB) substrate. The PCB substrate includes metal contact pads arranged along a connector (bottom) edge, and multiple wiring traces that provide signal paths between the IC devices and the contact pads. An important aspect of the present invention is the IC devices are packaged and surface mounted on the PCB substrate such that an upper surface of each of these IC devices defines a plane that is substantially parallel to the planar PCB surface on which it is mounted, although the height of each IC device may vary. In particular, the planar upper surfaces of these IC devices are used to secure the memory module PCBA to planar underside surfaces of the heat sink plates by way of the adhesive.

According to an embodiment of the present invention, the adhesive is a heat-activated or heat-cured adhesive that is applied to either the upper surface of the one or more IC devices, or to the planar underside surfaces of the heat-sink plates. When applied, the adhesive is viscous and has a relatively low adhesion to facilitate manipulation of the cover and memory module PCBA until a desired orientation is achieved. The adhesive is then compressed between the heat-sink plate and IC devices, and is held in the compressed state using a fixture. The fixture is then passed through an oven maintained at a specified temperature (i.e., at or lower than the maximum safe operating temperature for the memory module components) to activate or cure the adhesive. In one embodiment, a heat-activated adhesive is used that exhibits a relatively low adherence prior to being heated to a high temperature (i.e., equal to or less than the maximum safe operating temperature of the memory module assembly), and the heat-activated adhesive exhibits a high adherence when subsequently cooled. In this case, subsequent removal of the heat-sink plates from the memory module PCBA requires reheating at a predetermined temperature to reflow the adhesive. In another embodiment, the heating process is used to "cure" a relatively highly thermally conductive adhesive, subsequent separation of the heat-sink plate requires the use of a chemical solvent to dissolve the heat-cured adhesive. In both cases, unauthorized tampering (i.e., removal of the heat-sink plates to access the IC devices) is rendered more difficult and easier to detect than conventional memory modules that utilize clips or fasteners. Further, the heat-cured adhesive is thin and thermally conductive to reduce thermal resistance between the IC devices and the heat-sink plates, thus facilitating a relatively high rate of heat flow from the IC devices to maintain relatively low operating temperatures. Thus, the use of heat-activated and/or heat-cured adhesive facilitates a greatly thinner memory module with heat sink and simplified assembly process whereby the heat-sink plates are secured to protect the memory module PCBA in a manner that reduces overall manufacturing costs, and prevents unauthorized tampering.

According to another embodiment of the present invention, the one or two heat-sink plates are respectively attached to the memory module PCBA solely by the adhesive attached between the cover and the one or more IC devices. Unlike conventional assemblies that utilize clips and/or fasteners to secure the heat sink covers to the memory module substrate and/or to each other, in one embodiment, the adhesive is relied upon solely to secure the cover to the memory module, thereby greatly simplifying the production process. In alternative embodiments, one or more fasteners may be utilized in addition to the adhesive to provide a more rigid connection between the memory module PCBA and the heat-sink plates.

DETAILED DESCRIPTION

The present invention relates to improvements in memory module assemblies (i.e., a memory module printed circuit board assembly (PCBA) and one or more heat-sink plates). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figures 1A, 1B:
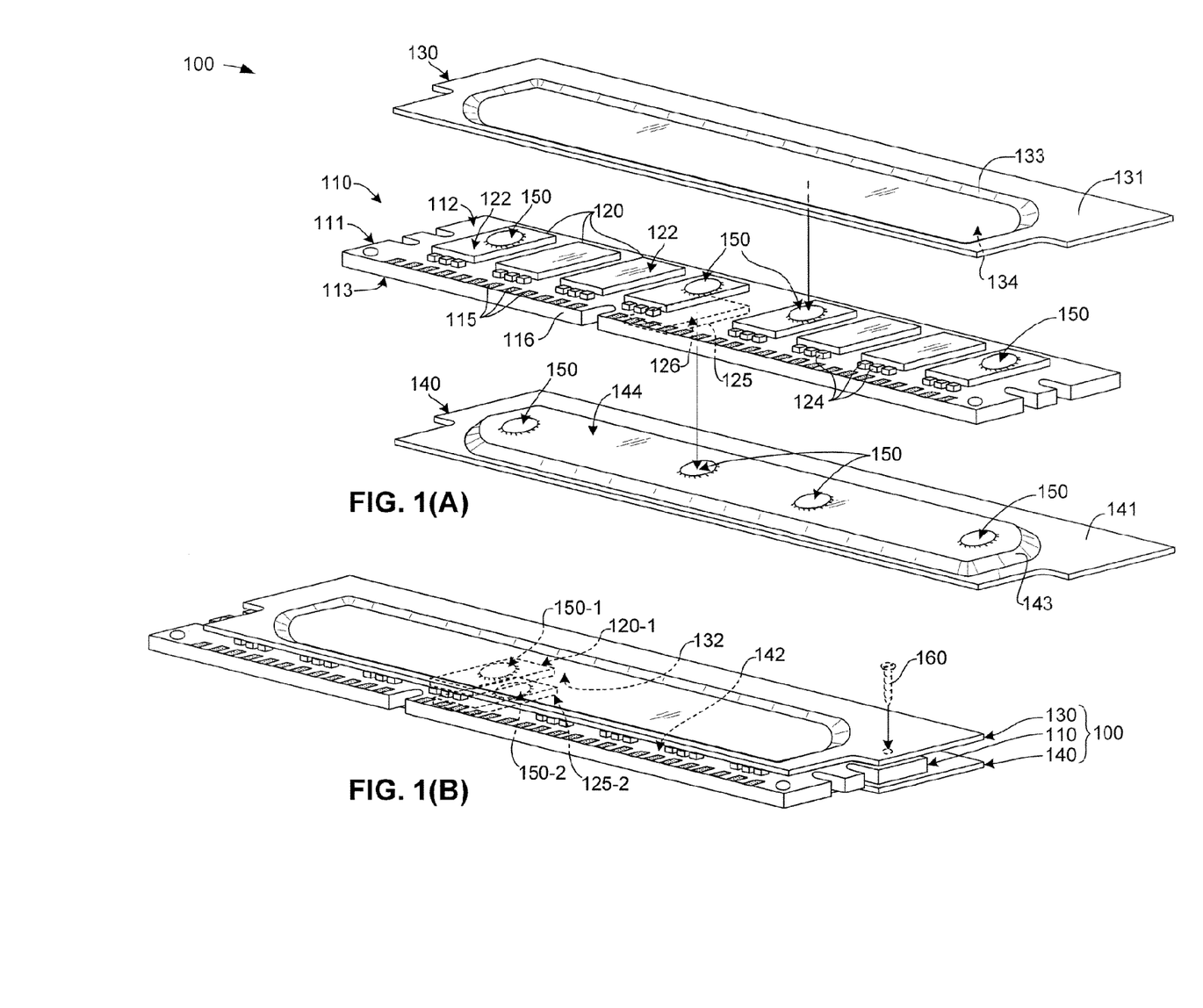
FIGS. 1(A) and 1(B) are an exploded perspective view and an assembled perspective view, respectively, showing a memory module assembly according to an embodiment of the present invention.
Figure 2:
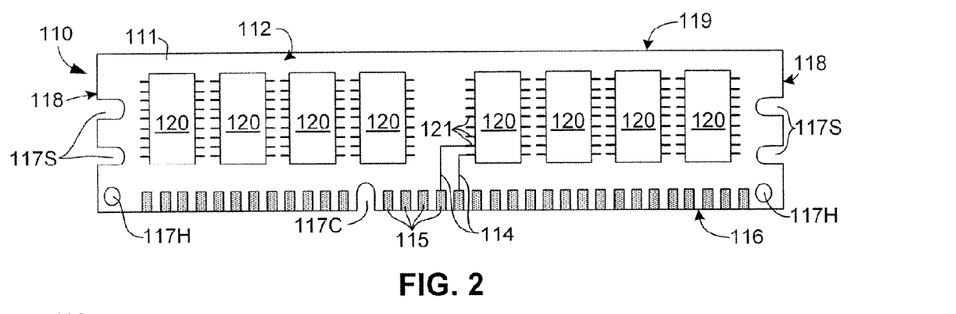
FIG. 2 is a top view showing a memory module PCBA of the memory module assembly shown in FIG. 1(A).
Figure 3:
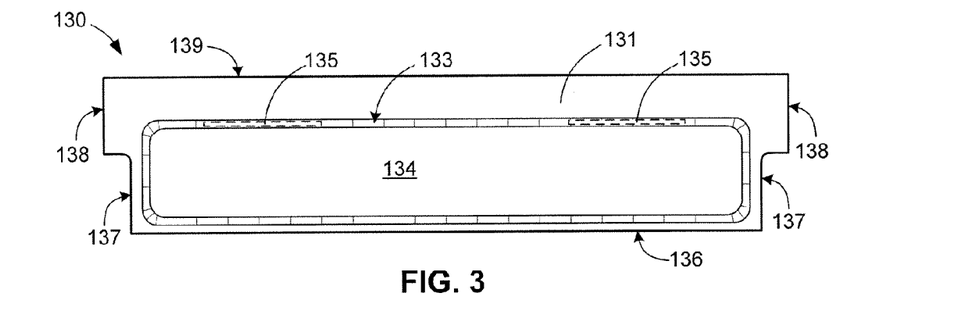
FIG. 3 is a top view showing a heat-sink plate of the memory module assembly shown in FIG. 1(A).
Figure 4A:
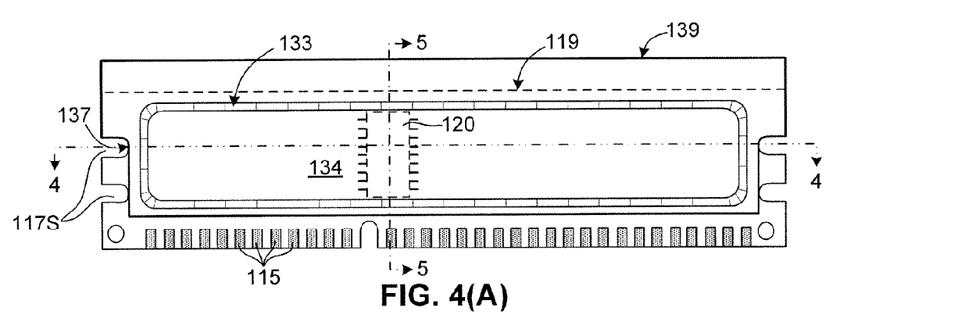
FIGS. 4(A) and 4(B) are top and cross-sectional side views showing the memory module assembly shown in FIG. 1(A).
Figure 4B:
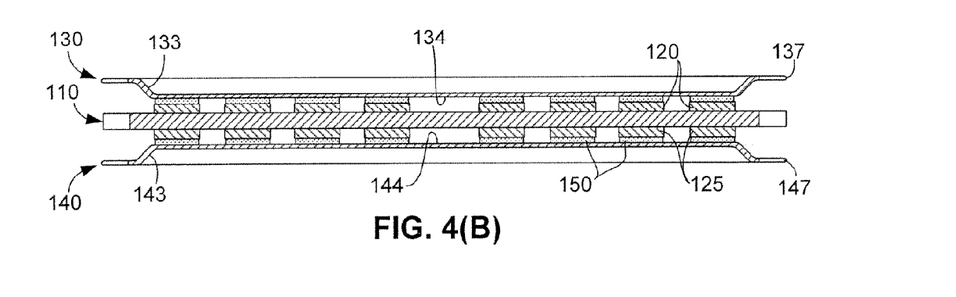
Figures 5, 6A:
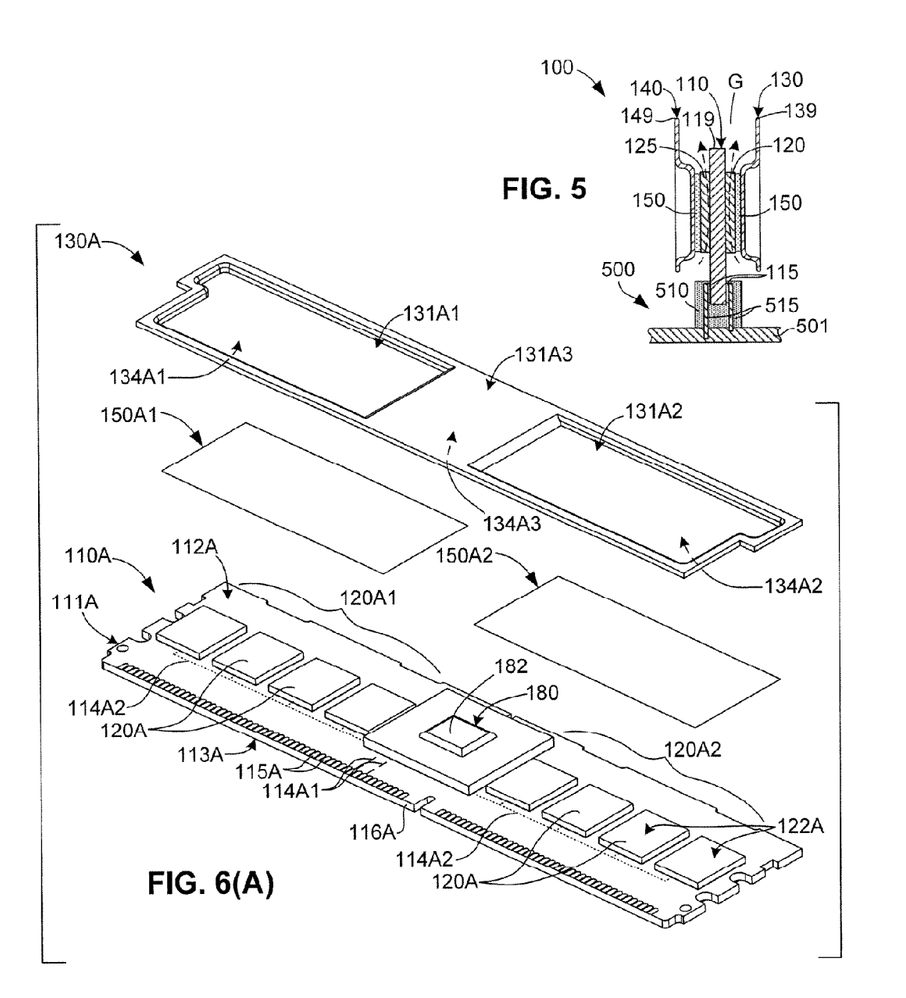
FIG. 5 is a cross-sectional end view showing the memory module assembly shown in FIG. 1(A).
FIGS. 6(A) and 6(B) are exploded perspective and cross-sectional side views showing a FB-DIMM type memory module assembly according to another embodiment of the present invention.

FIGS. 1(A) to 5 show a memory module assembly 100 according to a simplified embodiment of the present invention. Memory module assembly 100 generally includes a memory module PCBA 110 and one or more heat-sink plates 130 and 140. FIGS. 1(A) and 1(B) are exploded perspective and assembled perspective views, respectively, showing the basic components of memory module assembly 100. FIG. 2 is a top view showing memory module PCBA 110 by itself, and FIG. 3 is a top plan view showing heat-sink plate 130 by itself. FIGS. 4(A) and 4(B) are top and cross-sectional side views, respectively, showing heat-sink plates 130 and 140 mounted on memory module PCBA 110. Finally, FIG. 5 is a cross-sectional end view taken along section line 5-5 of FIG. 4(A). Although the embodiment described below utilizes two heat-sink plates (i.e., plates 130 and 140) mounted onto opposite sides of memory module PCBA 110, unless otherwise specifically recited in the appended claims, only one heat-sink plate (i.e., plate 130 or plate 140) may be attached to only one side of memory module PCBA 110 in the manner described below.

Referring to FIGS. 1(A) and 2, memory module PCBA 110 includes a printed circuit board (PCB) substrate 111 having an upper (first) surface 112 and an opposing lower (second) surface 113, and several integrated circuit (IC) memory devices (e.g., dynamic-random-access memory (DRAM) devices) 120 and/or 125 that are mounted on at least one of the upper and lower surfaces. PCB substrate 111 includes a network of wiring traces 114 (shown in FIG. 2) that are formed on at least one of upper surface 112 and lower surface 113, and extend through layers of insulating material (e.g., FR4) according to known manufacturing techniques. Selected wiring traces 114 are connected between contact leads 121 of selected memory devices 120 and associated contact pads 115 that are arranged in a row along a lower (connector) edge 116 on both surfaces 112 and 113 of PCB substrate 111. Metal contact pads 115 facilitate pluggable connection of memory module assembly 100 into a host system (e.g., a PC or other computer system) to increase available memory capacity by way of memory devices 120. Referring to FIG. 5, when memory module assembly 100 is mounted into a host system 500, metal contact pads 115 mate with pads 515 on a module socket 510 to electrically connect the module to the host system's motherboard 501. Optional side edge notches 117S, holes 117H, and connector edge notch 117C are provided along side edges 118 and connector edge 116 to ensure that the module is correctly positioned in the socket. Upper edge 119 is located opposite to connector edge 116.

Although generally referred to herein as memory devices, IC devices 120 and 125 may include one or more additional control IC devices, such as a processor, an application specific integrated circuit (ASIC), and/or a programmable logic device (PLD). Further in addition, to IC devices 120 and 125, additional electrical and electronic components 124 (shown in FIG. 1(A)), such as capacitors and inductors, may be included on PCB substrate 111 using known techniques.

According to an embodiment of the invention, each memory device is packaged such that its upper surface is planar (e.g., Thin Small Outline Package (TSOP)), and is maintained such that each planar upper surface is parallel to PCB substrate 111. For example, as shown in FIG. 1(A), each memory device 120 is mounted on upper surface 112 such that its planar upper surface 122 is maintained parallel to upper surface 112. Similarly, each memory device 125 is mounted on lower surface 113 such that its planar upper surface 126 is maintained parallel to lower surface 113.

Referring to FIGS. 1(A) and 3, heat-sink plates 130 and 140 are metal structures formed, for example, from a suitable sheet metal (e.g., copper or aluminum). As indicated in FIG. 1(A), in one embodiment, heat-sink plate 130 includes a flat peripheral region 131 surrounding a depression (indentation) region 133, and a planar underside surface 134 formed on the outside (convex, lower facing) surface of depression 133. Similarly, heat-sink plate 140 includes a flat peripheral region 141 surrounding a depression (indentation) region 143, and a planar underside surface 144 formed on the outside (upward facing) surface of depression 143. As discussed below, underside surfaces 134 and 144 are secured in the manner described below to one or more associated memory devices 120 and 125. Note that, as indicated in FIG. 4(B), depression regions 133/143 are formed such that the footprint of these regions encloses all of IC devices 120/125 (i.e., such that planar underside surfaces 134/144 contact all of upper surfaces 122/126 of IC devices 120/125). As shown in FIG. 3, one or both heat-sink plates (e.g., plate 130) may include one or more slots 135 for heat dissipation. Each heat-sink plate 130/140 has a lower edge 136/146, side edges 138/148, and an upper edge 139/149. In addition, as shown in FIG. 3, the side edges of each plate are modified to expose the notches formed in PCB substrate 111 (e.g., plate 130 includes a groove 137 for exposing side notches 117S, as indicated in FIG. 4(A)).

As indicated in FIGS. 1(B), 4(A), 4(B) and 5, when heat-sink plates 130/140 are mounted onto memory module PCBA 110, heat-sink plates 130/140 substantially overlap PCB surfaces 112/113 in such a way that IC devices 120/125 are protected, but contact pads 115 are exposed for pluggable insertion of contact pads 115 into host socket 510 (shown in FIG. 5). For example, as indicated in FIGS. 4(A) and 5, front edge 136 of heat-sink plate 130 is aligned above connector edge 116 of PCB substrate 111 such that contact pads 115 extend below lower edges 136/145 of heat-sink plates 130/140, and upper edges 139/149 of heat-sink plates 130/140 protrude above upper edge 119 of PCB substrate 111. Referring to FIG. 5, an opening (gap) G is provided between heat-sink plates 130/140 and PCB substrate 111 adjacent to upper edges 139/149 to allow air heated by IC devices 120/125 to escape. Note that side edges 137/147 and upper edges 139/149 of heat-sink plates 130/150 may be bent inward/downward to narrow the space therebetween (e.g., gap G) to provide a better protection for the electronic components from potential dust contamination, but this may reduce air flow. The upward air flow (e.g., as indicated by dashed arrows in FIG. 5) induced by free convection will enhance heat dissipation from IC devices 120/125, and thus reduce the operating temperature of memory module assembly 100. Of course, in addition to the heat dissipated by Free convection in the generally upward directions, heat is also dissipated to the surrounding air from the external surfaces of heat-sink plates 130/140 by free convection and radiation.

Referring to FIGS. 1(A), 1(B), 4(A), 4(B) and 5, according to the present invention, adhesive portions 150 are applied to planar upper surfaces 122/126 of selected memory devices 120/125 and/or to planar underside surfaces 134/144 of heat-sink plates 130/140, and are then sandwiched therebetween in a manner that secures heat-sink plates 130/140 to memory module PCBA 110. For example, as indicated in FIG. 1(B), a discrete adhesive portion 150-1 (shown in dashed lines) is sandwiched between planar underside surface 134 of heat-sink plate 130 and upper surface 122 of an associated IC device 120-1 (also shown in dashed lines) such that heat-sink plate 130 is secured to memory module PCBA 110 by adhesive portion 150-1. Similarly, a second discrete adhesive portion 150-2 is sandwiched between planar underside surface 144 of heat-sink plate 140 and upper surface 126 of an associated IC device 125-2 (also shown in dashed lines) such that heat-sink plate 140 is secured to memory module PCBA 110 by adhesive portion 150-2. By securing heat-sink plates 130/140 to memory module 110 using adhesive portions 150 instead of fasteners, the manufacturing process for producing memory module assemblies 100 is greatly simplified, and in addition tampering (i.e., removal of heat-sink plates 130/140 to access IC devices 120/125) is more reliably prevented and more easily detected.

According to an embodiment of the present invention, adhesive portions 150 comprise heat-activated adhesive that is applied to either upper surfaces 122/126 of one or more IC devices 120/125, or to the planar underside surfaces 134/144 of heat-sink plates 130/140. In this embodiment, the heat-activated adhesive 150 is softened (i.e., exhibits a relatively low adherence) when heated to a high temperature (i.e., equal to or less than the maximum operating temperature of the memory module assembly), and the heat-activated adhesive exhibits a high adherence when subsequently cooled. The advantage of such heat-activated adhesives is that they can be removed by heating, and thus enable reworking. In this case, subsequent removal of the heat-sink plates from the memory module PCBA requires reheating at a predetermined temperature to reflow the adhesive. Heat-activated adhesives of this type are typically produced in the form of thin film or tape can be used for IC devices that generate less heat, and the main purpose of heat-sink plates 130/140 is thus relegated to mainly protecting the IC devices. Such heat-activated adhesive material forms a thin and continuous layer between the heat-sink plate and the upper external surface of the IC devices. As the newly formed interface layer is thin and can he made substantially void-free (i.e., very few air bubbles), the thermal resistance through the adhesive layer is relatively small. The ability to rework, for example through heating, becomes an important consideration. Thermoplastic based adhesive material such as thermal bonding film (e.g., product numbers TBF615, TBF668) produced by 3M of St. Paul Minn., or hot melt film (e.g., product number 7802) produced by Henkel Loctite Corp. (Industrial) of Rocky Hill Conn. can be used as an adhesive in this application.

While heat-activated adhesives provide an advantage in that they can be reworked by reheating, such adhesives typically exhibit relatively low thermal conductivity, thus making them less desirable in applications that require a high level of heat dissipation through the heat-sink plates.

In another embodiment, adhesive portions 150 comprise an adhesive material that is "cured" during a heating process (i.e., exhibits an initial, relatively low adherence when applied, and a relatively high adherence after being heat-cured). Such heat-cured adhesives typically exhibit relatively high thermal conductivity relative to heat-activated adhesives, and are therefore more desirable in applications that require a high level of heat dissipation through the heat-sink plates. The heat-cured adhesive material is applied in the form of paste, and is re-distributed under heat and pressure during curing to bond the IC devices and heat-sink plates together. The curing process takes place at elevated temperature, and can be expedited with the use of activator. The re-distribution process causes the adhesive material to flow and fill the void between the heat sink plate and memory surface, resulting in a thin, good contact therebetween that reduces thermal resistance from the heat source (IC device) to the heat-sink plate. A dispensing machine can be used to ensure even distribution of the adhesive material. In one embodiment, the heat-cured adhesive consists of silicone elastomer-based resin for re-workability and survivability at elevated temperature that the electronic components may encounter. Metallic fillers may be added to improve thermal conductivity. On suitable heat-cured adhesive is provided by Dow Corning (e.g., product number 3-6752). Such adhesives are removed using solvent to enable rework.

Although heat-activated and heat-cured adhesive materials provide superior connection between the heat-sink plates and memory module PCBA, it is also possible to use other types of adhesives in the manner described herein to provide suitable connections. Therefore, unless otherwise specified in the appended claims, the term "adhesive portion" is intended to include any non-corrosive adhesive that can reliably connect the heat-sink plates and memory module PCBAs described herein.

In addition, although the present invention is described above with certain benefits associated with attaching heat-sink plates 130 and 140 to memory module PCBA 110 solely by adhesive portions 150, in some embodiments an optional fastener (e.g., a screw 160, rivet or clamp, which is shown in dashed lines in FIG. 1(B)) or clip may be utilized to further strengthen the assembly connection. Exemplary embodiments utilizing interacting fasteners are described below with reference to FIGS. 6(A) to 11(D).

The embodiment described above with reference to FIGS. 1(A) to 5 includes heat-sink plate edge features that maximize cooling efficiency by allowing essentially unimpeded airflow under the heat sink plates (i.e., between the heat sink plates and the PCB substrate). Even though the area between the heat sink and substrate is small and mostly occupied by the IC (e.g., memory and controller) devices, small gaps between adjacent pairs of IC devices can channel air flow past the IC devices, directly cooling the IC devices as well as cooling the heat sink plate from both the underside surface and its larger, exposed top surface. The inventors encourage this airflow through the tiny channels between IC devices by maintaining openings (e.g., gap G shown in FIG. 5) near the top edge of the memory module assembly. These openings allow air to escape from between the PCB substrate and the heat sink plates. Air enters the gaps between the heat sink and the PCB substrate from the open bottom edge near the lower connector edge, and flows between the memory devices and out the top-edge openings. Stagnant air under the heat sink plates is thus reduced.

Figure 6B:
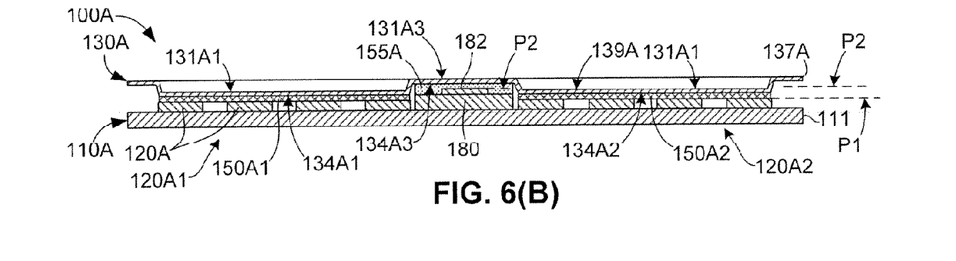

FIGS. 6(A) and 6(B) are exploded perspective and cross-sectional side views showing a FB-DIMM-type memory module assembly 100A according to another embodiment of the present invention. Memory module assembly 100A includes an FB-DIMM printed circuit board assembly (PCBA) 110A, a heat-sink plate 130A, and high thermal conductive adhesive film portions 150A1 and 150A2.

Similar to PCBA 110 (described above), FB-DIMM PCBA 110A includes a substrate 111A having opposing first and second surfaces 112A and 113A, and (first) wiring traces 114A1 connected to associated metal contact pads 115A that are disposed along a connector edge 116A of substrate 111A. In addition, several memory (first IC) devices 120A (e.g., DRAM devices) which are mounted on upper surface 112A. Memory devices 120A are arranged in two groups: a first group 120A1 and a second group 120A2. As in the previous embodiments, upper surfaces 122A of devices 120A substantially define a first plane P1 (shown in FIG. 6(B)) that is parallel to first surface 112A of substrate 111A.

FB-DIMM PCBA 110A differs from PCBA 110 in that it includes an advanced memory buffer (AMB) device 180 disposed on the first surface 112A between device groups 120A1 and 120A2. AMB devices (e.g., produced by NEC Electronics of Japan) are recently developed IC devices utilized to configure FB-DIMMs in a way that greatly improves communications between FB-DIMM PCBA 110A and a host system. In general, AMB device 180 is connected to "upstream" and "downstream" serial links by way of traces 114A1, and is connected to DRAM devices 120A by way of the bus indicated by dashed line 114A2. Serial data from the host memory controller sent through the downstream serial link (southbound) is temporarily buffered by AMB device 180, and then sent to DRAM devices 120A. The serial data contains the address, data and command information given to the DRAM, converted in AMB 180 and sent out to the DRAM bus. AMB 180 writes in and reads out from DRAM devices 120A as instructed by the host system memory controller (not shown). The read data is converted to serial data, and sent back to the memory controller on the upstream serial link (northbound) Other features and functions performed by AMB 180 are known to those skilled in the art of producing memory modules.

As indicated in FIG. 6(B), features typical of AMB device 180 are that it has a taller profile than DRAM devices 120A, and it is housed in a Ball Grid Array (BGA) package. In particular, an upper surface 182 of AMB device 180 defines a (second) plane P2 that is parallel to substrate surface 112A, and is located above plane P1 defined by DRAM devices 120A (i.e., plane P1 is located between plane P2 and surface 112A). As is understood in the art, BGA packaged devices are connected to underlying substrates (e.g., PCB 111A) by way of solder or solder-like connections that are relatively brittle (i.e., in comparison to the pin-type connections utilized to mount DRAMs 120A). These relatively brittle connections typically require protection from mechanical shock to prevent cracking of the connections that can result in electrical disconnection.

Similar to the embodiments described above, heat-sink plate 130A includes recessed regions 131A1 and 131A2 that respectively include planar underside surfaces 134A1 and 134A2, and these regions are secured to the upper surfaces 122A of DRAM devices 120A by way of high thermal conductive adhesive film portions 150A1 and 150A2. In particular, adhesive film portion 150A1 is sandwiched between planar underside surface 134A1 and the upper surface 122A of DRAM devices 120A of group 120A1. Similarly, adhesive film portion 150A2 is sandwiched between planar underside surface 134A2 and upper surfaces 122A of DRAM devices 120A of group 120A2. Thus, heat-sink plate 130A is rigidly secured to PCBA 110A by adhesive portions 150A1 and 150A2 in a manner similar to that described above.

In accordance with another aspect of the present invention, in order to accommodate the taller profile of AMB device 180, heat-sink plate 130A includes a raised pocket region 131A3 that is disposed between recessed regions 131A1 and 131A2, and has a planar underside surface 134A3 that is positioned above planar underside surfaces 134A1 and 134A2 (as indicated in FIG. 6(B)). Further, in order to minimize mechanical shock while providing suitable heat transfer between AMB device 180 and raised pocket region 131A3, a soft thermal compound 155A is disposed between the upper surface 182 of the AMB device 180 and the planar underside surface 134A3. In one embodiment, thermal compound 155A includes one of a thermal paste produced by Vantec Thermal Technologies of Freemont, Calif. USA, or a silicone compound (SIL More, Taiwan).

Figure 7A:
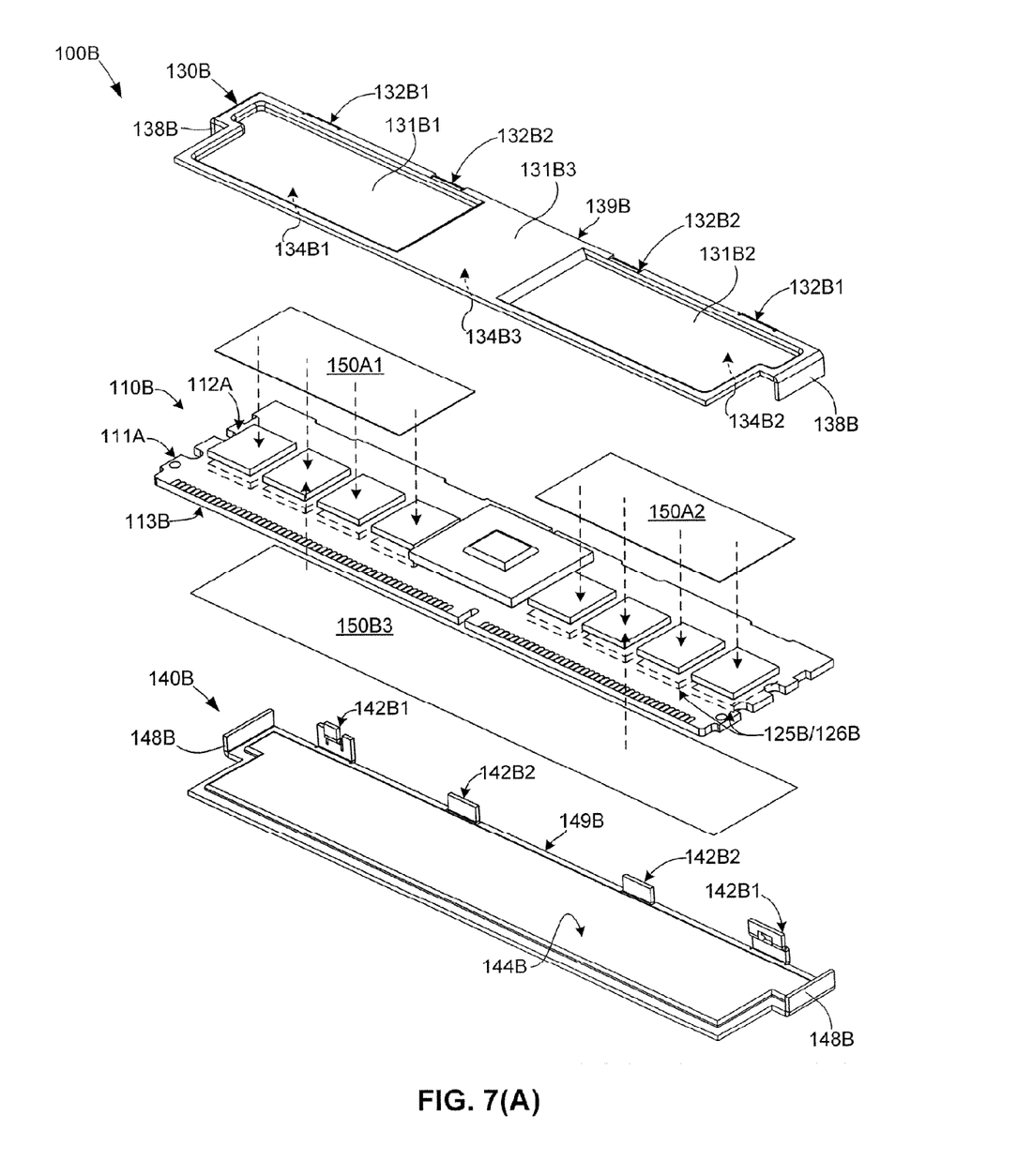
FIGS. 7(A), 7(B) and 7(C) are exploded perspective, front assembled perspective, and rear assembled perspective views showing a FB-DIMM type memory module assembly according to another embodiment of the present invention.
Figure 7B:
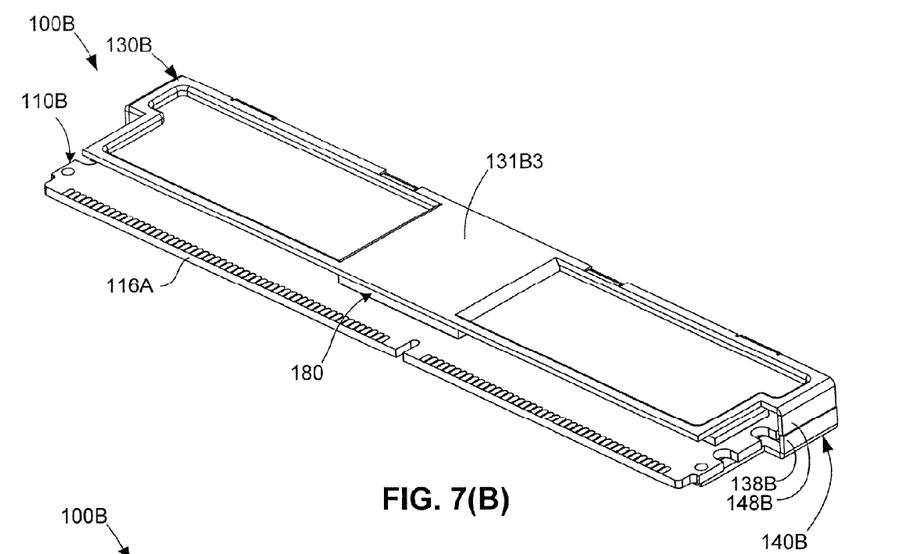
Figure 7C:
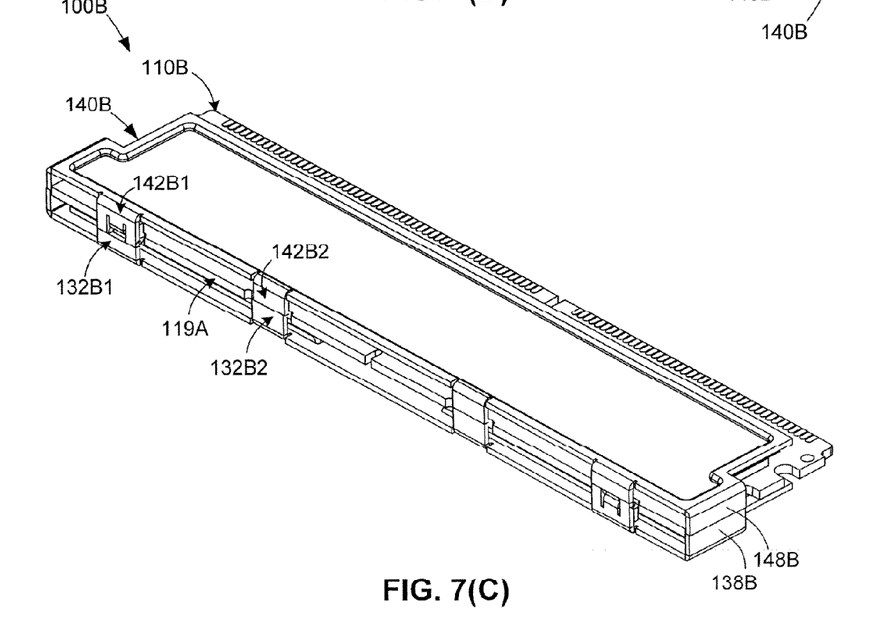

FIGS. 7(A), 7(B) and 7(C) are exploded perspective and assembled perspective views showing a FB-DIMM-type memory module assembly 100B according to another embodiment of the present invention. Memory module assembly 100B includes FB-DIMM PCBA 110B, an upper heat-sink plate 130B, a lower heat-sink plate 140B, and high thermal conductive adhesive film portions 150A1, 150A2 and 150B3.

FB-DIMM PCBA 110B is substantially identical to PCBA 110A (discussed above), but also includes DRAM devices 125B disposed on lower surface 113A. DRAM devices 125B are mounted and connected to AMB device 180 in the manner described above, and have upper surfaces 126B that define a (third) plane.

Similar to heat-sink plate 130A (discussed above), heat-sink plate 130B includes recessed regions 131B1 and 131B2 that respectively include planar underside surfaces 134B1 and 134B2, and a raised pocket region 134B3 that is disposed between recessed regions 131B1 and 131B2, and has a planar underside surface 134B3. Similar to heat-sink plate 130B (discussed above), lower heat-sink plate 140B includes a substantially planar underside surface 144B. During assembly, heat-sink plate 130B is secured by way of high thermal conductive adhesive film portions 150A1 and 150A2 in the manner described above. Similarly, adhesive film portion 150B3 is sandwiched between planar underside surface 144B and upper surfaces 126B of DRAM devices 125B, thereby securing lower heat-sink plate 140B to PCBA 110B.

In accordance with another aspect of the present invention, when both heat-sink plate 130B and 140B are mounted onto PCBA 110B (as indicated in FIGS. 7(B) and 7(C)), upper heat-sink plate 130B becomes fixedly connected to lower heat-sink plate 140B, thereby forming a rigid frame that further protects AMB device 180 from mechanical shock. In particular, as indicated in FIG. 7(A), heat-sink plate 130B includes side wall support structures 138B, and engagement structures 132B1 and end wall support structures 132B2, which extend downward from edge 139B. Conversely, lower heat-sink plate 140B includes a side wall support structures 148B, engagement structures 142B1, and end wall support structures 142B2 that extend upward from the side and end edge 149B. As shown in FIGS. 7(B) and 7(C), when mounted onto PCBA 110B, side wall support structures 138B of upper heat-sink plate 130B abut side wall support structures 148B of lower heat-sink plate 140B, and end wall support structures 132B2 abut corresponding end wall support structures 142B2, thereby preventing further movement of upper heat-sink plate 130B toward lower heat-sink plate 140B. In addition, engagement structures 132B1 of upper heat-sink plate 130B engage with engagement structures 142B1 of lower heat-sink plate 140B, thereby preventing movement of upper heat-sink plate 130B away from lower heat-sink plate 140B. By securing upper heat-sink plate 130B and lower heat-sink plate 140B to PCBA 110B by way of adhesive portions 150A1, 150A2 and 150B3, and by securing upper heat-sink plate 130B to lower heat-sink plate 140B to form a rigid frame, the present invention provides a FB-DIMM arrangement that is both easy and inexpensive to assemble and provides reliable protection for AMB device 180.

Figure 8A:
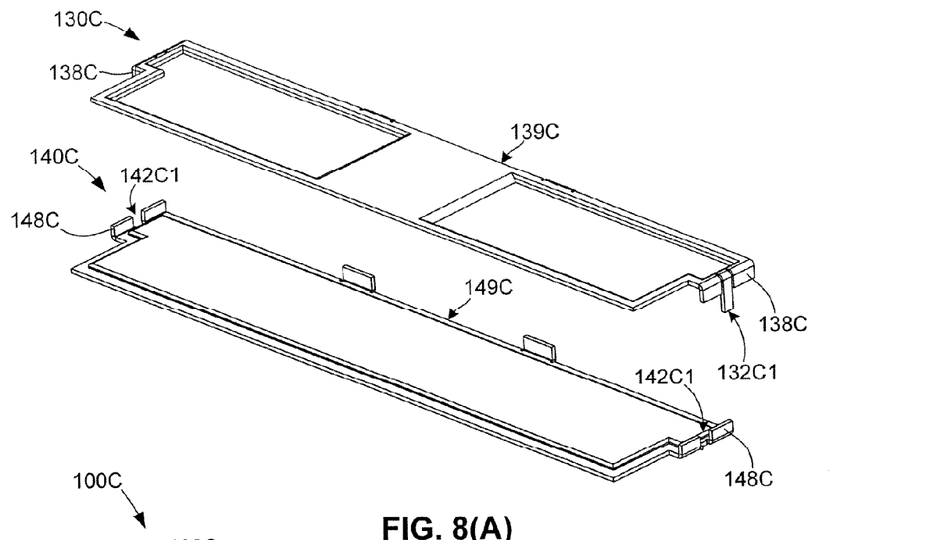
FIGS. 8(A), 8(B) and 8(C) are exploded perspective, front assembled perspective, and rear assembled perspective views showing a FB-DIMM type memory module assembly according to another embodiment of the present invention.
Figures 8B, 8C:
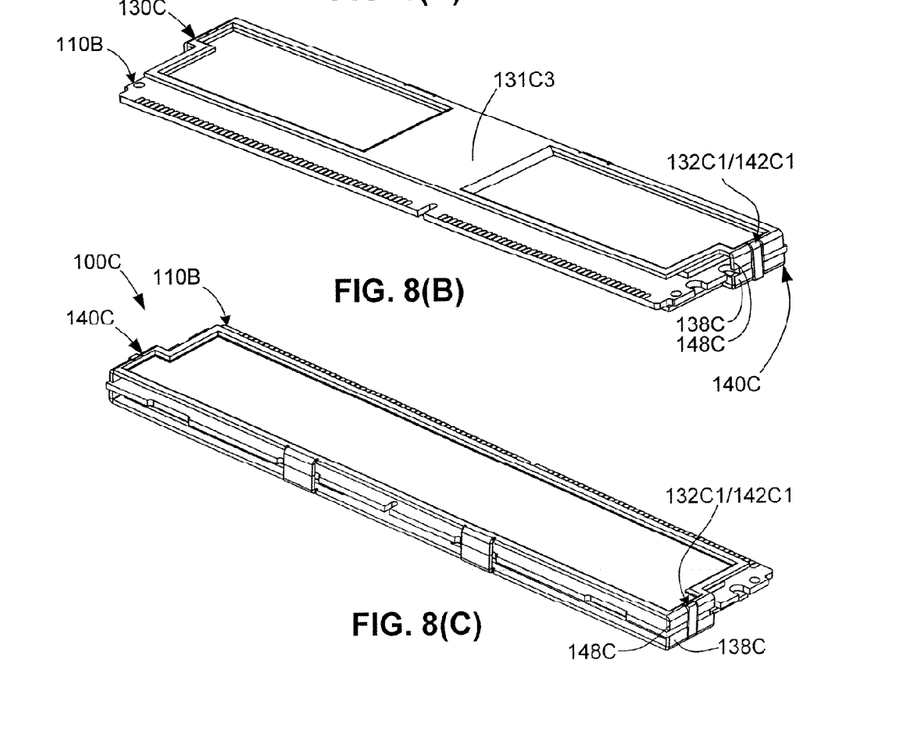

FIGS. 8(A), 8(B) and 8(C) are exploded perspective and assembled perspective views showing a FB-DIMM-type memory module assembly 100C according to another embodiment of the present invention. Memory module assembly 100C includes FB-DIMM PCBA 110B (discussed above), and an upper heat-sink plate 130C and a lower heat-sink plate 140C that are attached to FB-DIMM PCBA 110B in a manner similar to the method described above. Heat-sink plates 130C and 140C include structural features that are similar to heat-sink plates 130B and 140B (discussed above), but differ in that engagement structures 132C1 and 142C1 are disposed on side edges 138C and 148C, respectively, of heat-sink plates 130C and 140C, respectively, instead of along long edges 139C and 148C. In addition, engagement structures 132C1 include a latch that extends downward from side wall 138C and snaps over engagement structures 148C, as depicted in FIGS. 8(B) and 8(C), thus providing a possibly more reliable engagement arrangement.

Figure 9A:
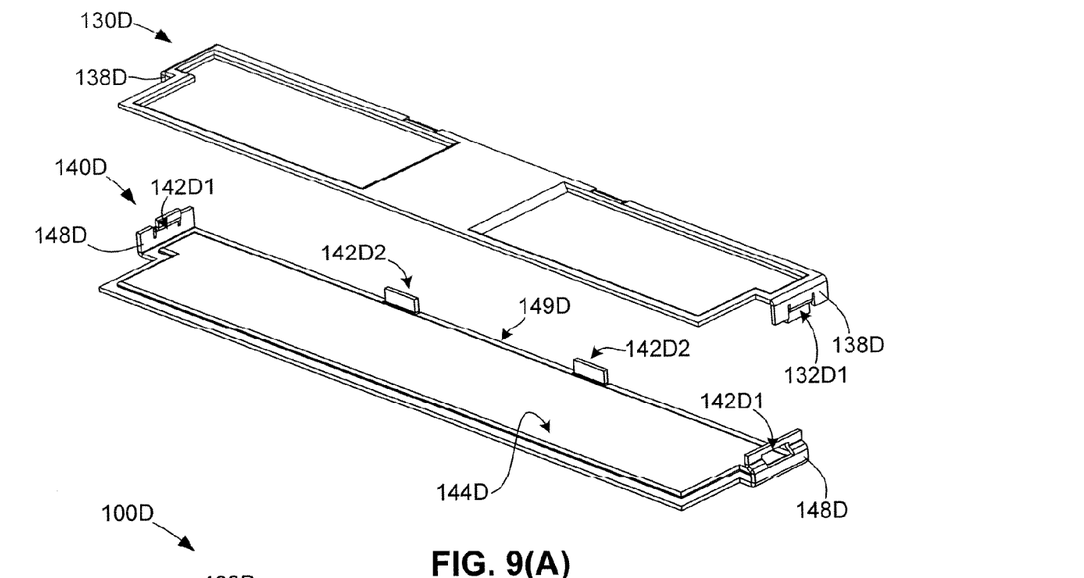
FIGS. 9(A), 9(B) and 9(C) are exploded perspective, front assembled perspective, and rear assembled perspective views showing a FB-DIMM type memory module assembly according to another embodiment of the present invention.
Figures 9B, 9C:
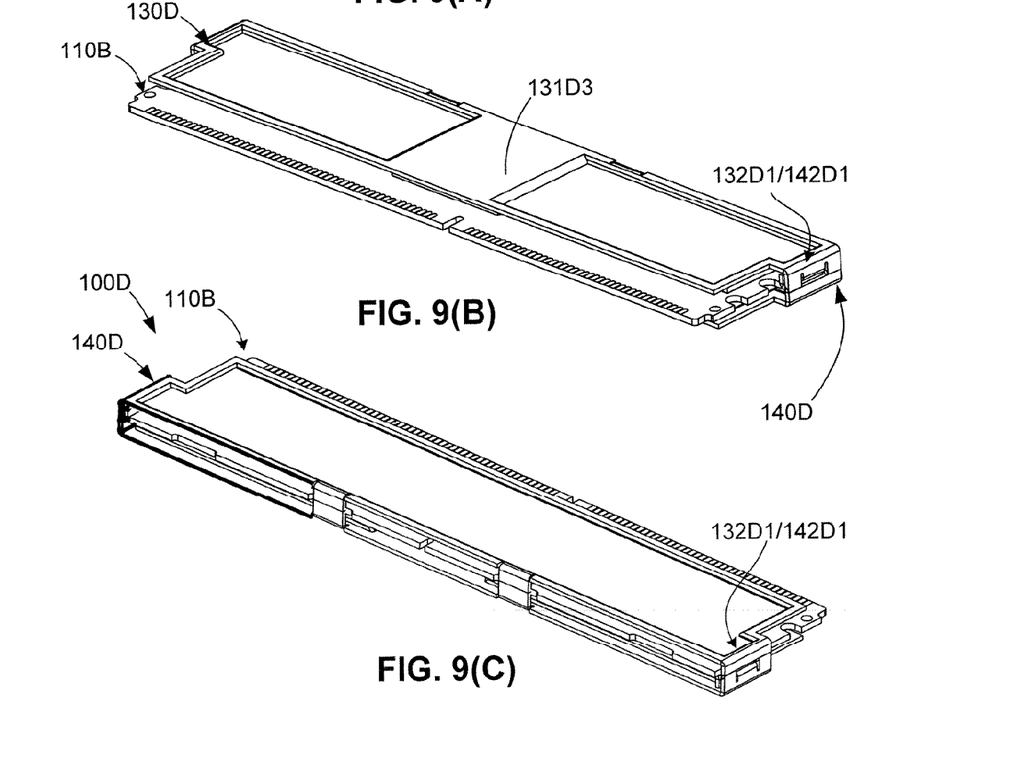

FIGS. 9(A), 9(B) and 9(C) are exploded perspective and assembled perspective views showing a FB-DIMM-type memory module assembly 100D according to another embodiment of the present invention. Memory module assembly 100D includes FB-DIMM PCBA 110B (discussed above), and an upper heat-sink plate 130D and a lower heat-sink plate 140D that are attached to FB-DIMM PCBA 100B in a manner similar to the method described above. Heat-sink plates 130D and 140D include structural features that are similar to heat-sink plates 130B and 140B (discussed above), but differ in that heat-sink plates 130D and 140D respectively include self-engaging interlock structures 132D1 and 142D1 disposed on side walls 138D and 148D, respectively, that become engaged simply by pressing interlock structures 132D1 into interlock structures 142D, thereby simplifying the assembly process.

Figure 10A:
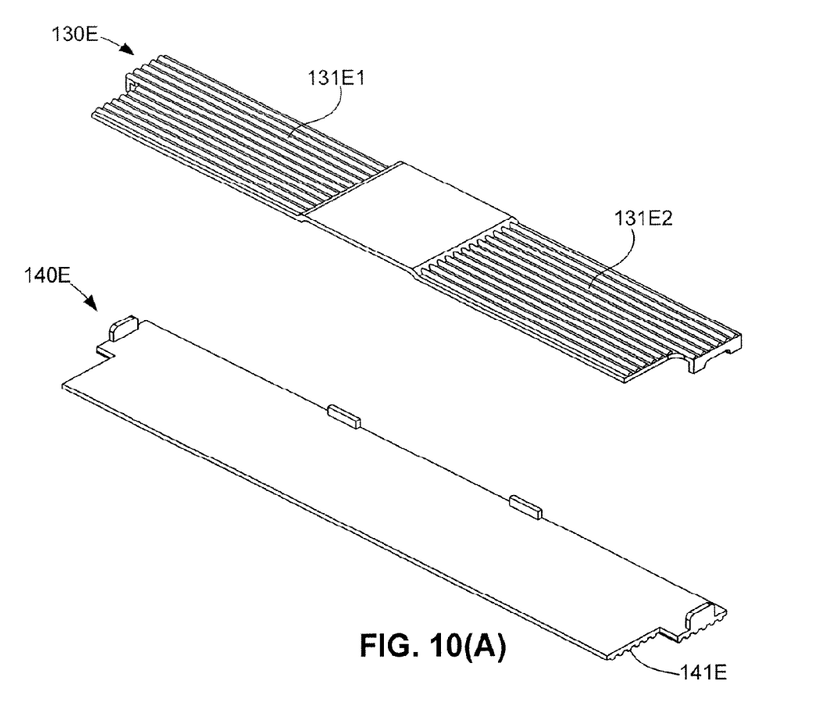
FIGS. 10(A) and 10(B) are exploded perspective and rear assembled perspective views showing a FB-DIMM type memory module assembly according to another embodiment of the present invention.
Figure 10B:
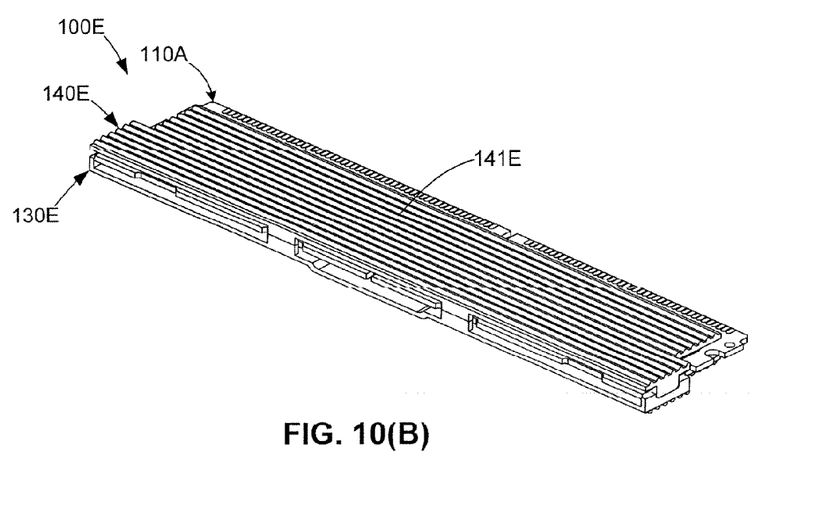

FIGS. 10(A) and 10(B) are exploded perspective and assembled perspective views showing a FB-DIMM-type memory module assembly 100E according to yet another embodiment of the present invention. Memory module assembly 100E includes FB-DIMM PCBA 110B (discussed above), and an upper heat-sink plate 130E and a lower heat-sink plate 140E that are attached to FB-DIMM PCBA 110B in a manner similar to the method described above. Heat-sink plates 130E and 140E include structural features that are similar to heat-sink plates 130B and 140B (discussed above), but differ in that the outside surfaces of heat-sink plates 130B and 140B include ridged fins 131E1, 131E2, and 141E that facilitate convective heat transfer.

Figure 11A:
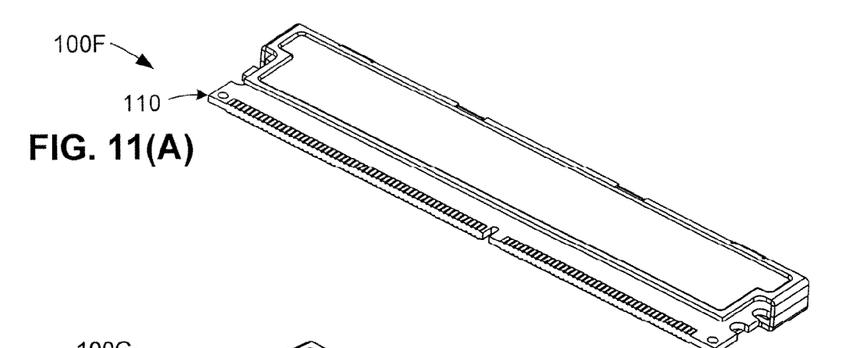
FIGS. 11(A), 11(B), 11(C) and 11(D) are perspective views showing four DDR2-type memory module assemblies according to further embodiments of the present invention.
Figure 11B:
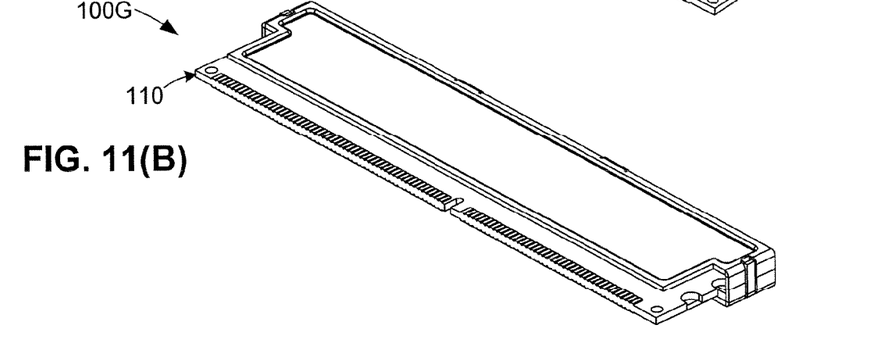
Figures 11C, 11D:
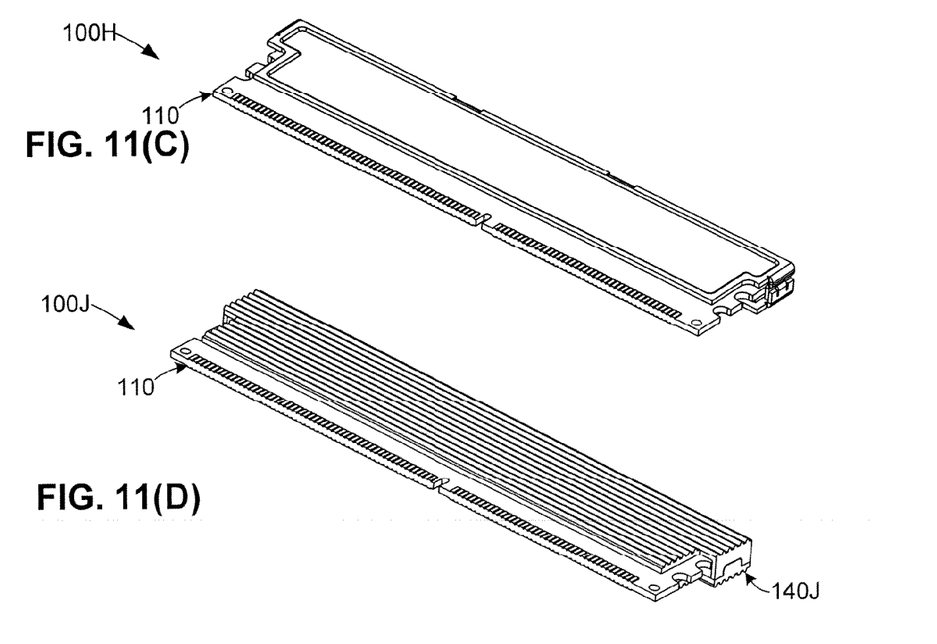

While the various features discussed above with reference to FIGS. 8(A) to 10(B) are particularly useful in FB-DIMM arrangements for protecting the ABM device, these features may also be utilized in conjunction with DDR2 arrangements as well. For example, FIG. 11(A) shows a DDR2-type memory module assembly 100F that combines the heat-sink arrangement of FB-DIMM-type memory module assembly 100B (discussed above with reference to FIGS. 7(A) to 7(C)) with a conventional DDR2 type PCBA 110 (discussed above). Similarly, FIG. 11(B) shows a DDR2-type memory module assembly 100G that combines the heat-sink arrangement of FB-DIMM-type memory module assembly 110C (discussed above with reference to FIGS. 8(A) to 8(C)) with a conventional DDR2 type PCBA 110 (discussed above). Likewise, FIG. 11(C) shows a DDR2-type memory module assembly 100H that combines the heat-sink arrangement of FB-DIMM-type memory module assembly 100D (discussed above with reference to FIGS. 9(A) to 9(C)) with a conventional DDR2 type PCBA 110 (discussed above). Finally, FIG. 11(D) shows a DDR2-type memory module assembly 100J that combines the heat-sink arrangement of FB-DIMM-type memory module assembly 100E (discussed above with reference to FIGS. 10(A) and 10(B)) with a conventional DDR2 type PCBA 110 (discussed above). Note that in each of the embodiments shown in FIGS. 11(A) to 11(D), the upper heat-sink plate does not include the raised pocket structure utilized in the FB-DIMM embodiments discussed above.

Several other embodiments are contemplated by the inventors. For example the heat sink may be made from a variety of heat-conducting materials such as aluminum, aluminum alloy, copper, brass, bronze, stainless steel, etc.

Figure 12:
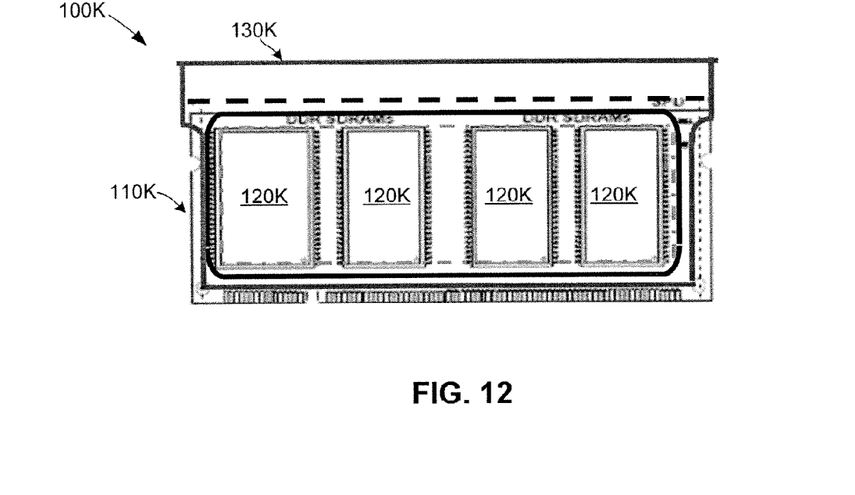
FIG. 12 is a top view showing a memory module assembly according to another embodiment of the present invention.

FIG. 12 is a modified top view showing a memory module assembly 100K according to yet another embodiment of the present invention. Memory module assembly 100K differs from previously described embodiments in that it includes a memory module PCBA 110K that is in the form of a Small Outline Dual Inline memory Module (SODIMM). This type of memory module is used mostly for notebook computers, with Thin Small Outline Package (TSCP). The number of memory devices 120K is typically reduced in half, with each side of memory module assembly 100K including a row of up to four devices. Adhesive is applied according to the previously described embodiments to the memory devices or the inside of the heat-sink plates (e.g., heat sink plate 130K), before the heat sink plates are attached to the memory module PCBA 110K. All the other features of memory module assembly 100K are similar to those described above. Further, in addition to the SODIMM arrangement shown in FIG. 12, the present invention may be incorporated into memory module assemblies including any of a Single Inline Memory Module (SIMM) device, a Dual Inline Memory Module (DIMM) device, and a Small Outline DIMM (SODIMM) device.

Terms such as "upper edge", "side edge", "lower edge", "front surface", "back surface" and "underside surface" are arbitrarily assigned as shown in the figures and each term could refer to either surface of the module and/or heat-sink structure. Vias of through-holes may provide electrical connection between the surfaces or intermediate layers. These through-holes could he filled in holes or metal traces between layers rather than open holes, and can also be formed during the PCB processing as an integral part of the PCB. Various alternatives in geometries of the heat-sink plates and memory modules could be substituted.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A memory module assembly comprising:
    a memory module printed circuit board assembly (PCBA) including:
        a substrate having opposing first and second surfaces, a plurality of first wiring traces formed on at least one of the first and second surfaces, each of the first wiring traces being connected to an associated metal contact pad formed along a connector edge of the substrate; and
        a first plurality of first integrated circuit (IC) devices and a second plurality of said first IC devices disposed on the first surface of the substrate such that upper surfaces of the first and second pluralities of first IC devices define a first plane that is parallel to the first surface of the substrate, and a second IC device disposed on the first surface between the first and second pluralities of first IC devices, the second IC device having an upper surface defining a second plane that is parallel to the first surface of the substrate, wherein the first plane is located between the second plane and the first surface of the substrate;

a first heat-sink plate including first and second recessed regions respectively defining first and second planar underside surfaces, and a raised pocket region defining a third planar underside surface, the pocket region being disposed between the first and second recessed regions and first and second adhesive portions, the first adhesive portion being sandwiched between the first planar underside surface and the upper surface of at least one of said first plurality of said first IC devices, and the second adhesive portion being sandwiched between the second planar underside surface and the upper surface of at least one of said second plurality of said first IC devices, whereby the first heat-sink plate is rigidly secured to the memory module by the first and second adhesive portions.

2. The memory module assembly of claim 1, wherein each of the first and second adhesive portions comprises a heat-activated adhesive material exhibiting a first, relatively low adherence when heated to a first, relatively high temperature, and exhibiting a second, relatively high adherence when subsequently cooled to a second, relatively low temperature.

3. The memory module assembly according to claim 2, wherein each of the first and second adhesive portions comprises a high thermal conductive adhesive film.

4. The memory module assembly according to claim 3, wherein the first heat-sink plate is secured to the memory module PCBA solely by the first and second adhesive portions.

5. The memory module assembly of claim 1, substrate further comprises second wiring traces forming a bus, wherein the first IC devices comprise dynamic random access memory (DRAM) devices connected to the bus, and wherein the second IC device comprises an advanced memory buffer (AMB) device that is connected to each of the first and second pluralities of first IC devices by way of the bus, the AMB device also being connected to said plurality of first wiring traces.

6. The memory module assembly of claim 5, further comprising a thermal compound disposed between the upper surface of the AMB device and the third planar underside surface.

7. The memory module assembly of claim 6, wherein the thermal compound comprises one of a thermal paste and a silicone compound.

8. The memory module assembly according to claim 1, wherein the first heat-sink plate is mounted onto the memory module PCBA and substantially overlaps the first substrate surface in such a way that the first and second pluralities of said first IC devices and the second IC device are covered by the first heat-sink plate, and the connector edge is exposed such that the contact pads are exposed for pluggable insertion into a host socket.

9. The memory module assembly according to claim 1, wherein the memory module PCBA comprises a Fully-Buffered Dual In-line Memory Module (FB-DIMM).

10. The memory module assembly according to claim 1, wherein the memory module further comprises a plurality of third IC devices mounted on the second surface of the substrate such that an upper surface of each of the plurality of third IC devices defines a third plane that is parallel to the second surface, and wherein the memory module assembly further comprises a second heat-sink plate having a planar underside surface, and at least one third heat-activated adhesive portion sandwiched between the planar underside surface and the upper surface of at least one of the plurality of third IC devices such that the second heat-sink plate is rigidly secured to the memory module by said at least one third adhesive portion.

11. The memory module assembly according to claim 10, wherein the third IC devices comprise dynamic random access memory (DRAM) devices.

12. The memory module assembly according to claim 10, further comprising means for rigidly connecting the first heat-sink plate to the second heat-sink plate.

13. The memory module assembly according to claim 12, wherein said means comprises:

first support structures disposed on one or more edges of the first heat-sink plate and extending perpendicular to the first plane, and second support structures disposed on one or more edges of the second heat-sink plate and extending perpendicular to the first plane, wherein each first support structure abuts a corresponding second support structure such that the first heat-sink plate is prevented from moving toward the second heat-sink plate.

14. The memory module assembly according to claim 12, wherein said means comprises:

a first engagement structure disposed on an edge of the first heat-sink plate and extending perpendicular to the first plane, and a second engagement structure disposed on an edge of the second heat-sink plate and extending perpendicular to the first plane, wherein the first engagement structure is operably engaged to the second engagement structure such that the first heat-sink plate is prevented from moving away from the second heat-sink plate.

15. The memory module assembly according to claim 12, wherein said first engagement structure is disposed on a long edge of the first heat-sink plate, and wherein said second engagement structure is disposed on a long edge of the second heat-sink plate.

16. The memory module assembly according to claim 12, wherein said first engagement structure is disposed on a short edge of the first heat-sink plate, and wherein said second engagement structure is disposed on a short edge of the second heat-sink plate.

17. The memory module assembly according to claim 12, wherein at least one of the first engagement structure and the second engagement structure comprises a latch.

18. The memory module assembly according to claim 12, wherein the first engagement structure and the second engagement structure comprise a self-engaging, interlocking structure.

19. The memory module assembly according to claim 12, wherein at lease one of the first heat-sink plate and the second heat-sink plate comprise ridged fins.

20. A memory module assembly comprising:
a memory module printed circuit board assembly (PCBA) including:
a substrate having opposing first and second surfaces, a plurality of wiring traces formed on the first and second surfaces, at least some of the wiring traces being connected to metal contact pads formed along a connector edge of the substrate, and
a plurality of first integrated circuit (IC) devices mounted on the first surface of the substrate such that an upper surface of each of the plurality of first IC devices defines a first plane that is parallel to the first surface of the substrate, and
a plurality of second IC devices mounted on the second surface of the substrate such that an upper surface of each of the plurality of second IC devices defines a second plane that is parallel to the second surface;
a first heat-sink plate having a first planar underside surface;
a second heat-sink plate having a second planar underside surface;
a plurality of heat-activated adhesive portions including a first adhesive portion sandwiched between the first planar underside surface of the first heat-sink plate and the upper surface of an associated IC device of said plurality of first IC devices such that the first heat-sink plate is rigidly secured to the memory module by the plurality of first adhesive portions, and a second adhesive portion sandwiched between the second planar underside surface of the second heat-sink plate and the upper surface of an associated IC device of said plurality of second IC devices such that the second heat-sink plate is rigidly secured to the memory module by the plurality of second adhesive portions; and
means for rigidly connecting the first heat-sink plate to the second heat-sink plate.

21. The memory module assembly according to claim 20, wherein said means comprises:
first support structures disposed on one or more edges of the first heat-sink plate and extending parallel to the first plane, and
second support structures disposed on one or more edges of the second heat-sink plate and extending parallel to the first plane,
wherein each first support structure abuts a corresponding second support structure such that the first heat-sink plate is prevented from moving toward the second heat-sink plate.

22. The memory module assembly according to claim 20, wherein said means comprises:
a first engagement structure disposed on an edge of the first heat-sink plate and extending perpendicular to the first plane, and
a second engagement structure disposed on an edge of the second heat-sink plate and extending perpendicular to the first plane,
wherein the first engagement structure is operably engaged to the second engagement structure such that the first heat-sink plate is prevented from moving away from the second heat-sink plate.

23. The memory module assembly according to claim 22, wherein said first engagement structure is disposed on a long edge of the first heat-sink plate, and wherein said second engagement structure is disposed on a long edge of the second heat-sink plate.

24. A memory module assembly comprising:
a memory module printed circuit board assembly (PCBA) including:
a substrate having opposing first and second surfaces, a plurality of wiring traces formed on the first and second surfaces, at least some of the wiring traces being connected to metal contact pads formed along a connector edge of the substrate, and
a plurality of first integrated circuit (IC) devices mounted on the first surface of the substrate such that an upper surface of each of the plurality of first IC devices defines a first plane that is parallel to the first surface of the substrate, and
a plurality of second IC devices mounted on the second surface of the substrate such that an upper surface of each of the plurality of second IC devices defines a second plane that is parallel to the second surface;
a first heat-sink plate having a first planar underside surface;
a second heat-sink plate having a second planar underside surface;
a plurality of heat-activated adhesive portions including a first adhesive portion sandwiched between the first planar underside surface of the first heat-sink plate and the upper surface of an associated IC device of said plurality of first IC devices such that the first heat-sink plate is rigidly secured to the memory module by the plurality of first adhesive portions, and a second adhesive portion sandwiched between the second planar underside surface of the second heat-sink plate and the upper surface of an associated IC device of said plurality of second IC devices such that the second heat-sink plate is rigidly secured to the memory module by the plurality of second adhesive portions; and
means for rigidly connecting the first heat-sink plate to the second heat-sink plate, wherein said means comprises:
a first engagement structure disposed on an edge of the first heat-sink plate and extending perpendicular to the first plane, and
a second engagement structure disposed on an edge of the second heat-sink plate and extending perpendicular to the first plane,
wherein the first engagement structure is operably engaged to the second engagement structure such that the first heat-sink plate is prevented from moving away from the second heat-sink plate, and
wherein said first engagement structure is disposed on a short edge of the first heat-sink plate, and wherein said second engagement structure is disposed on a short edge of the second heat-sink plate.

25. The memory module assembly according to claim 22, wherein at least one of the first engagement structure and the second engagement structure comprises a latch.

26. The memory module assembly according to claim 22, wherein at the first engagement structure and the second engagement structure comprise a self-engaging, interlocking structure.

27. The memory module assembly according to claim 20, wherein at lease one of the first heat-sink plate and the second heat-sink plate comprise ridged fins.

* * * * *